(12) United States Patent
Hofmeester et al.

(10) Patent No.: US 7,564,024 B2
(45) Date of Patent: Jul. 21, 2009

(54) METHODS AND APPARATUS FOR ASSIGNING A BEAM INTENSITY PROFILE TO A GAS CLUSTER ION BEAM USED TO PROCESS WORKPIECES

(75) Inventors: Nicolaus J. Hofmeester, Danvers, MA (US); Steven P. Caliendo, Ashby, MA (US); Thomas G. Tetreault, Manchester, NH (US); Ruairidh MacCrimmon, Arlington, MA (US)

(73) Assignee: TEL Epion Inc., Billerica, MA (US)

( * ) Notice: Subject to any disclaimer, the term of this patent is extended or adjusted under 35 U.S.C. 154(b) by 208 days.

(21) Appl. No.: 11/770,405

(22) Filed: Jun. 28, 2007

(65) Prior Publication Data

US 2009/0001282 A1 Jan. 1, 2009

(51) Int. Cl.
*G21K 5/04* (2006.01)
(52) U.S. Cl. ....................................................... 250/251
(58) Field of Classification Search .................. 250/251
See application file for complete search history.

(56) References Cited

U.S. PATENT DOCUMENTS

| 6,537,606 | B2 | 3/2003 | Allen et al. | |
|---|---|---|---|---|
| 2008/0237491 | A1* | 10/2008 | Caliendo et al. | 250/492.3 |
| 2008/0237492 | A1* | 10/2008 | Caliendo et al. | 250/492.3 |

* cited by examiner

*Primary Examiner*—Kiet T Nguyen
(74) *Attorney, Agent, or Firm*—Wood, Herron & Evans LLP

(57) ABSTRACT

Embodiments of the invention describe methods and apparatus for assigning a beam intensity profile to a gas cluster ion beam and processing workpieces using a gas cluster ion beam. One embodiment includes generating a gas cluster ion beam in a gas cluster ion beam processing apparatus, collecting parametric data relating to the spatial intensity of the gas cluster ion beam, and generating a beam intensity profile describing the spatial intensity of the gas cluster ion beam by fitting a mathematical functional shape to the parametric data. Another embodiment describes a method for processing a workpiece using a gas cluster ion beam.

23 Claims, 5 Drawing Sheets

METHODS AND APPARATUS FOR ASSIGNING A BEAM INTENSITY PROFILE TO A GAS CLUSTER ION BEAM USED TO PROCESS WORKPIECES

FIELD OF THE INVENTION

The field of invention relates generally to the field of semiconductor integrated circuit manufacturing and, more specifically but not exclusively, relates to methods using a gas cluster ion beam for processing workpieces.

BACKGROUND OF THE INVENTION

Gas-cluster ion beams (GCIB's) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the workpiece. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper subsurface damage that is characteristic of conventional ion beam processing.

Conventional cluster ion sources produce cluster ions having a wide size distribution scaling with the number of molecules in each cluster that may reach several thousand molecules. Clusters of atoms can be formed by the condensation of individual gas atoms (or molecules) during the adiabatic expansion of high-pressure gas from a nozzle into a vacuum. A skimmer with a small aperture strips divergent streams from the core of this expanding gas flow to produce a collimated beam of clusters. Neutral clusters of various sizes are produced and held together by weak interatomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, nitrous oxide, and mixtures of these gases.

Several emerging applications for GCIB processing of workpieces on an industrial scale are in the semiconductor field. Although GCIB processing of workpieces is performed using a wide variety of gas-cluster source gases, many of which are inert gases, many semiconductor processing applications use reactive source gases, sometimes in combination or mixture with inert or noble gases, to form the GCIB.

Although gas cluster ion beams have been used to process workpieces, new methods are needed for assigning beam intensity profiles to gas cluster ion beams for improved processing of workpieces.

BRIEF DESCRIPTION OF THE DRAWINGS

The present invention is illustrated by way of example and not as a limitation in the figures of the accompanying drawings.

DETAILED DESCRIPTION

Figure 1:
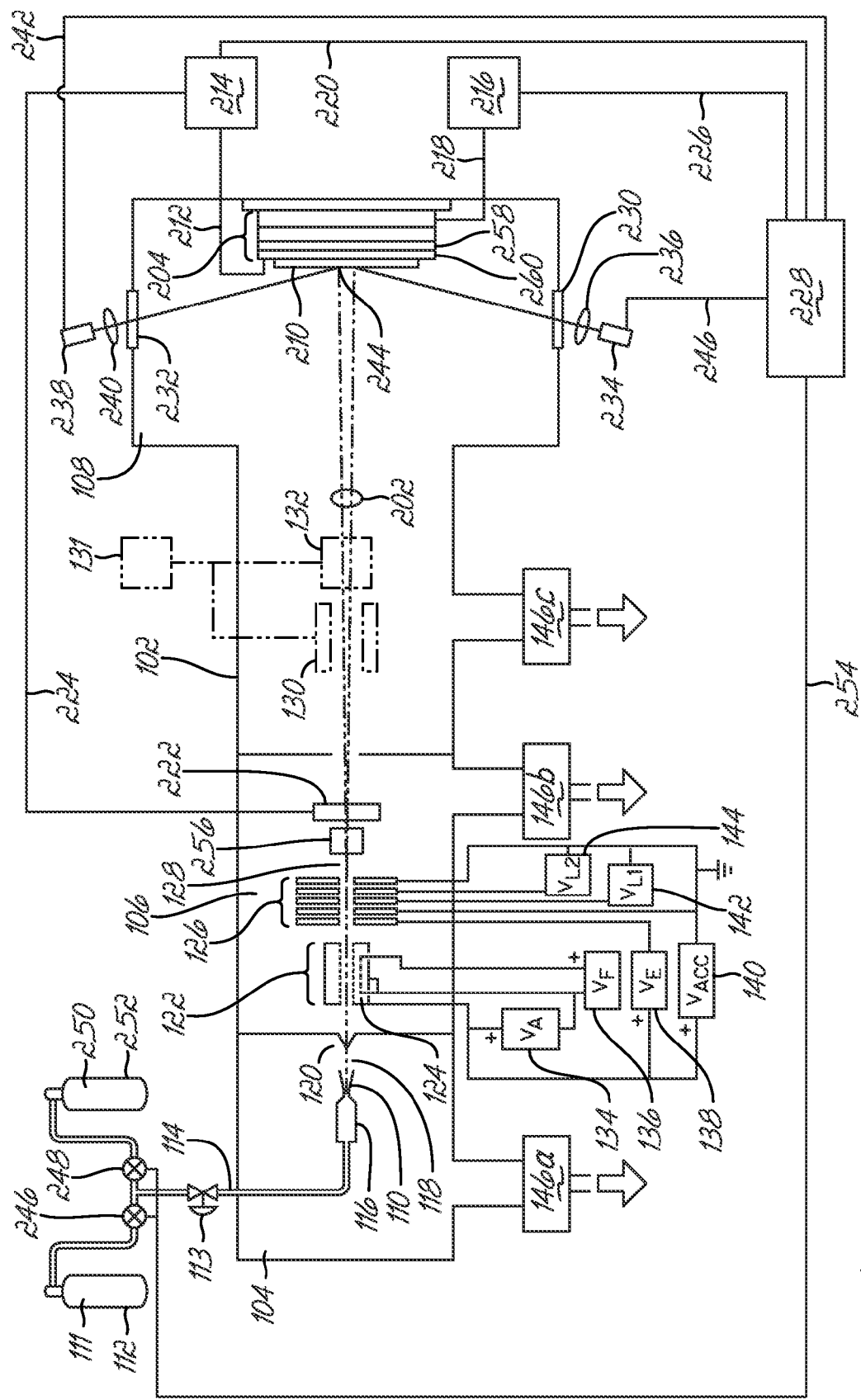
FIG. 1 is a diagrammatic view of a GCIB processing apparatus.

A processing system and method for assigning a beam intensity profile to a gas cluster ion beam and processing a workpiece using a gas cluster ion beam is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

There is a general need for assigning a beam intensity profile to a gas cluster ion beam by fitting a mathematical functional shape to parametric data relating to the beam intensity profile. Processing a workpiece by scanning the gas cluster ion beam across a workpiece, where a scanning pattern is selected based at least in part on the fitted mathematical functional shape, provides a more repeatable and constant processing.

With reference to FIG. 1, a GCIB processing apparatus 200 includes a vacuum vessel 102 divided into communicating chambers that include a source chamber 104, an ionization/acceleration chamber 106, and a processing chamber 108 separated from the source chamber 104 by the ionization/acceleration chamber 106. The chambers 104, 106, 108 are evacuated to suitable operating pressures by vacuum pumping systems 146a, 146b, and 146c, respectively. A condensable source gas 112 (for example, argon (Ar), carbon dioxide ($CO_2$), oxygen ($O_2$), or nitrogen ($N_2$)) stored in a source gas cylinder 111 is admitted under pressure through a gas metering valve 113 and a gas feed tube 114 into a stagnation chamber 116. The source gas is subsequently ejected from the stagnation chamber 116 into the substantially lower pressure vacuum inside the source chamber 104 through a properly shaped nozzle 110. In one example, the stagnation chamber 116 may have the same or similar diameter as the gas feed tube 114. A gas jet 118 results inside the source chamber 104. Cooling, which results from the rapid expansion of the gas jet 118, causes a portion of the gas jet 118 to condense into clusters, each consisting of from several to several thousand weakly bound atoms or molecules.

A gas skimmer aperture 120 situated between the source chamber 104 and ionization/acceleration chamber 106 partially separates any gas molecules that have not condensed into clusters from those that have condensed and become part of the gas jet 118. The removal of the un-condensed gas molecules minimizes pressure increases in the downstream regions where such higher pressures would be detrimental, such as in the ionization/acceleration chamber 106 near ionizer 122 and high voltage electrodes 126 and in the processing chamber 108.

After the gas jet 118 has been formed in the source chamber 104, the constituent gas clusters in gas jet 118 are ionized by ionizer 122. The ionizer 122 is typically an electron impact ionizer that produces electrons from one or more filaments 124 and accelerates and directs the electrons causing them to collide with the gas clusters in the gas jet 118 inside the ionization/acceleration chamber 106. The electron impact ejects electrons from molecules in the gas clusters to generate ionized molecules and thereby endows the gas clusters with a net positive charge to define cluster ions. A filament power supply 136 provides voltage $V_F$ to heat the ionizer filament 124.

A set of suitably biased high voltage electrodes 126 in the ionization/acceleration chamber 106 extracts the cluster ions from the ionizer 122. The high voltage electrodes 126 then accelerate the extracted cluster ions to a desired energy and focus them to define the GCIB 128. The kinetic energy of the cluster ions in GCIB 128 typically ranges from 1 thousand electron volts (keV) to several tens of keV. Anode power supply 134 provides voltage $V_A$ for accelerating electrons emitted from filament 124 and causing the electrons to bombard the gas clusters in gas jet 118, which produces cluster ions.

Extraction power supply 138 provides voltage $V_E$ to bias at least one of the high voltage electrodes 126 to extract ions from the ionizing region of ionizer 122 and to form the GCIB 128. Accelerator power supply 140 biases one of the electrodes 126 with respect to the ionizer 122 solely for the purpose of extracting and focusing the GCIB 128. The positive biasing of the ionizer 122 relative to ground potential by power supply 140 determines the total beam acceleration potential, $V_{Acc}$. Lens power supplies 142, 144 may be provided to bias some of the high voltage electrodes 126 with potentials (e.g., $V_{L1}$ and $V_{L2}$) to focus the GCIB 128. A beam filter 256 in the ionization/acceleration chamber 106 eliminates monomers or monomers and light cluster ions from the GCIB 128 to define a GCIB 202 that enters the processing chamber 108.

A beam gate 222 is disposed in the path of GCIB 128 in the ionization/acceleration chamber 106. Beam gate 222 has an open state in which the GCIB 128 is permitted to pass from the ionization/acceleration chamber 106 to the processing chamber 108 to define GCIB 202 and a closed state in which the GCIB 128 is blocked from entering the processing chamber 108. A control cable 224 conducts control signals from dosimetry processor 214 to beam gate 222. The control signals controllably switch beam gate 222 to between the open or closed states.

A workpiece 210, which may be a semiconductor wafer or other substrate to be processed by GCIB processing, is disposed in the path of the GCIB 202 in the processing chamber 108. Because most applications contemplate the processing of large workpieces 210 with spatially uniform results, a scanning system may be desirable to uniformly scan the GCIB 202 across large areas to produce spatially homogeneous results.

The GCIB 202 directed at the workpiece 210 may be substantially stationary (i.e., un-scanned). Workpiece 210 is held in the processing chamber 108 on a X-Y positioning table 204 operable to move the workpiece 210 in two axes, effectively scanning the workpiece 210 relative to the GCIB 202. The GCIB 202 impacts the workpiece 210 at a projected impact region 244 on a surface of the workpiece 210. By X-Y motion, the X-Y positioning table 204 can position each portion of a surface of the workpiece 210 in the path of GCIB 202 so that every region of the surface may be made to coincide with the projected impact region 244 for processing by the GCIB 202. An X-Y controller 216 provides electrical signals to the X-Y positioning table 204 through an electrical cable 218 for controlling the position and velocity in each of X-axis and Y-axis directions. The X-Y controller 216 receives control signals from, and is operable by, system controller 228 through an electrical cable 226. X-Y positioning table 204 moves by continuous motion or by stepwise motion according to conventional X-Y table positioning technology to position different regions of the workpiece 210 within the projected impact region 244. In one embodiment, X-Y positioning table 204 is programmably operable by the system controller 228 to scan, with programmable velocity, any portion of the workpiece 210 through the projected impact region 244 for GCIB processing by the GCIB 202.

Alternatively, orthogonally oriented electrostatic scan plates 130, 132 can be utilized to produce a raster or other scanning pattern of the GCIB 202 across the desired processing area on workpiece 210, instead of or in addition to using positioning table 204. When beam scanning is performed, a scan generator 131 provides X-axis and Y-axis scanning signal voltages to the scan plates 130, 132. The scanning signal voltages provided to the scan plates 130, 132 may be triangular waves of different frequencies that cause the GCIB 202 to scan the entire surface of workpiece 210.

The workpiece holding surface 260 of positioning table 204 is electrically conductive and is connected to a dosimetry processor 214 by an electrical lead 212. An electrically insulating layer 258 of positioning table 204 isolates the workpiece 210 and workpiece holding surface 260 from the other portions of the positioning table 204. Electrical charge induced in the workpiece 210 by the impinging GCIB 202 is conducted through workpiece 210, workpiece holding surface 260, and electrical lead 212 to the dosimetry processor 214 for measurement. Dosimetry processor 214 has integrating means for integrating the GCIB current to determine a GCIB processing dose. Under certain circumstances, a target-neutralizing source (not shown) of electrons, sometimes referred to as electron flood, may be used to neutralize the GCIB 202. In such case, a Faraday cup (not shown) may be used to assure accurate dosimetry despite the added source of electrical charge.

The processing chamber 108 includes optical windows 230 and 232. An optical transmitting transducer 234, which may also have additional transmitting optics 236, and an optical receiving transducer 238, which may also have additional receiving optics 240, form a conventional optical instrumentation system. The transmitting transducer 234 receives, and is responsive to, controlling electrical signals from the system controller 228 communicated through an electrical cable 246. The transmitting transducer 234 directs an optical beam through the optical window 230 toward the workpiece 210. The receiving transducer 238 detects the optical beam through optical window 232. The receiving transducer 238 sends measurement signals to the system controller 228 through an electrical cable 242.

The optical instrumentation system may comprise any of a variety of different instruments for tracking the progress of the GCIB processing. For example, the optical instrumentation system may constitute a spectroscopic ellipsometry system for measuring or mapping the thickness of the upper film layer on the workpiece 210. As another example, the optical instrumentation system may comprise a scatterometer for measuring or mapping the thickness of the layer on the workpiece surface. By operating under control of the system controller 228 and in conjunction with the X-Y positioning table 204, the optical instrumentation can map one or more characteristics of the workpiece 210.

In addition to source gas cylinder 111, the GCIB processing apparatus 200 has a second gas cylinder 250 for containing a source gas 252, which may be, for example, oxygen, nitrogen, carbon dioxide, nitric oxide, nitrous oxide, another oxygen-containing condensable gas, or sulfur hexafluoride. Shut-off valves 262 and 248 are operable by signals transmitted through electrical cable 254 by system controller 228 to select either source gas 112 or source gas 252 for GCIB processing.

The dosimetry processor 214 may be one of many conventional dose control circuits that are known in the art and may include, as a part of its control system, all or part of a programmable computer system. The X-Y controller 216 may include as part of its logic all, or part of, a programmable computer system. The dosimetry processor 214 may include as part of its logic all, or part of, a programmable computer system. Some or all of the logic of the X-Y controller 216 and dosimetry processor 214 may be performed by a small general purpose computer that also controls other portions of the GCIB processing apparatus 200, including the system controller 228.

In operation, the dosimetry processor 214 signals the opening of the beam gate 222 to irradiate the workpiece 210 with the GCIB 202. The dosimetry processor 214 measures the GCIB current collected by the workpiece 210 to compute the accumulated dose received by the workpiece 210. When the dose received by the workpiece 210 reaches a predetermined required dose, the dosimetry processor 214 closes the beam gate 222 and processing of the workpiece 210 is complete.

The dosimetry processor 214 is electrically coupled with the system controller 228 by an electrical cable 220. During processing of the workpiece 210, the dose rate is communicated by the dosimetry processor 214 to the system controller 228 by electrical signals transmitted over electrical cable 220. The system controller 228 analyzes the electrical signals to, for example, confirm that the GCIB beam flux is substantially constant or to detect variations in the GCIB beam flux. The X-Y controller 216 is responsive to electrical signals from the system controller 228 that are transmitted over an electrical cable 226. The X-Y controller 216 can scan the X-Y positioning table to position every part of the workpiece 210 for processing according to predetermined velocities that result in appropriate beam dwell times to etch material or to deposit material to the desired local thicknesses effective to provide a film of substantially uniform thickness.

As an alternative method, the GCIB 202 may be scanned at a constant velocity in a fixed pattern across the surface of the workpiece 210, but the GCIB intensity is modulated (often referred to as Z-axis modulation) to deliver an intentionally non-uniform dose to the sample. The GCIB intensity may be modulated in the GCIB processing apparatus 200 by any of a variety of methods, including varying the gas flow from a GCIB source supply; modulating the ionizer by either varying a filament voltage $V_F$ or varying an anode voltage $V_A$; modulating the lens focus by varying lens voltages $V_{L1}$ and/or $V_{L2}$; or mechanically blocking a portion of the gas cluster ion beam with a variable beam block, adjustable shutter, or variable aperture. The modulating variations may be continuous analog variations or may be time modulated switching or gating.

When processing a workpiece 210 with a gas cluster ion beam, a response function of the workpiece 210 can be linear with beam dwell time. Hence, when processing a workpiece 210, etching of the workpiece 210 or deposition of material on the workpiece 210 can be described by a beam intensity profile. The beam intensity profile can be presented as 3 dimensional (3D) intensity map that can be used along with a beam dwell-time map to process the workpiece 210. According to an embodiment of the invention, a beam intensity profile may be assigned to GCIB 202 (FIG. 1) using a mathematical distribution function fitted to a measured cross-sectional slice of the GCIB 202 in cylindrical coordinates with the beam propagation axis as the Z-axis of the coordinate system. In some instances, a response function of the workpiece 210 may be non-linear (e.g., $2^{nd}$ order) with beam dwell time.

According to embodiments of the invention, parametric data relating to a spatial intensity of a GCIB 202 is collected using a beam diagnostic system and a mathematical functional shape is fitted to the parametric data. The beam diagnostic system can, for example, include a metrology tool or a beam current analysis system. In one embodiment, the GCIB 202 is used to etch a feature in a workpiece 210 or in a film on the workpiece 210 and a metrology tool, for example a spectroscopic ellipsometer (SE), a frequency probe, or an interferometer, ex-situ to the vacuum vessel 102, is used to collect parametric data relating to a depth profile of the etched feature and the area around the etched feature. The workpiece 210 may be a test wafer used for assigning a beam intensity profile to the GCIB 202. The parametric data may contain a cross-sectional slice of the etched feature.

Figure 2:
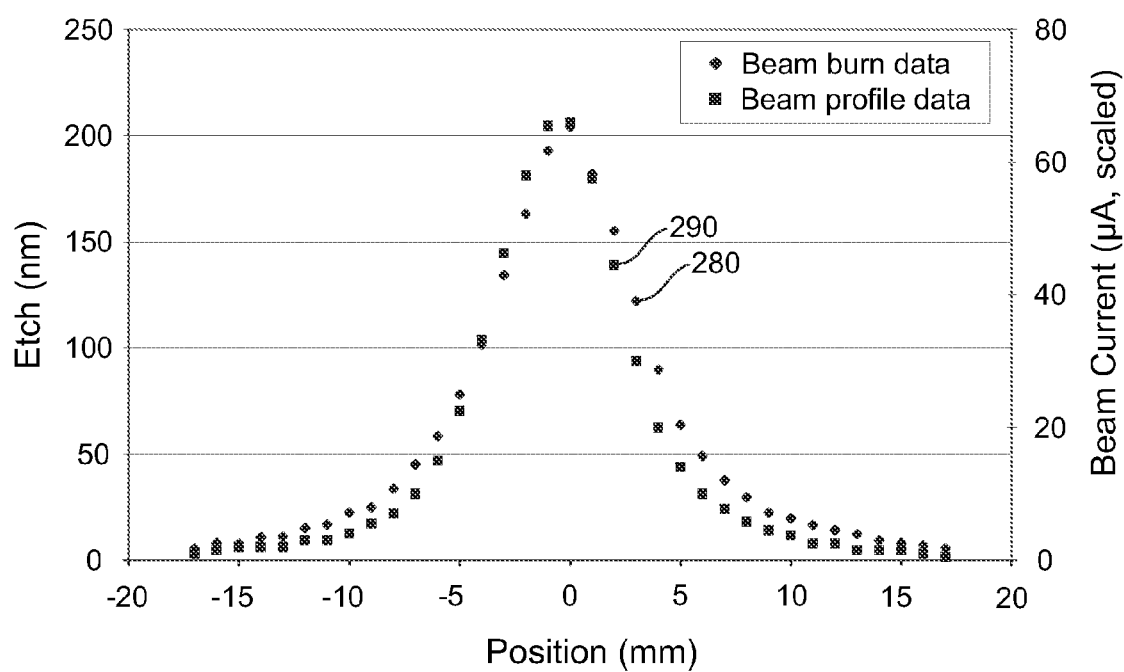
FIG. 2 shows parametric data relating to beam intensity profiles of a gas cluster ion beam according to embodiments of the invention.

FIG. 2 shows parametric data relating to beam intensity profiles of a gas cluster ion beam according to embodiments of the invention. A circular feature was etched in a $SiO_2$ film on a stationary workpiece 210 by a 5 sec exposure of a GCIB 202 containing a reactive source gas (5% $NF_3$ in $N_2$). The exposure was performed by generating the GCIB 202, blocking the entire GCIB 202, moving the workpiece 210 to a predetermined exposure position, unblocking the GGCIB 202, and performing a 5 sec exposure, blocking the entire GCIB 202, and removing the workpiece 210. Parametric data 280 (beam burn data in FIG. 2) was collected by scanning a spectroscopic ellipsometer twice at orthogonal angles across the etch feature and averaging the scans. In another example, parametric data may be measured using a two dimensional (2D) grid of test sites covering the entire etch feature.

In another embodiment, one or more trenches may be etched in a workpiece 210 or in a film on a workpiece 210 by scanning the GCIB 202 across a workpiece 210 and parametric data obtained by scanning a spectroscopic ellipsometer (or another metrology tool) across the etched trench(es). In one example, parametric data from orthogonal trenches on a workpiece 210 may be measured and averaged.

In another embodiment, a gas cluster ion beam may be used to deposit a material on a stationary workpiece 210 and a metrology tool, for example a spectroscopic ellipsometer, a frequency probe, an interferometer, or a profilometer, ex-situ to the vacuum vessel 102, can be used to collect parametric data from a cross-sectional slice deposited material or from a 2D grid of points covering the entire deposited material. Topographic data of the deposited material is analogous to an inverted depth profile of an etch feature described above.

In yet another embodiment, an in-situ beam current analysis system may be utilized to collect parametric data (beam current profile) relating to a beam intensity profile of the GCIB 202. The beam current profile may be measured at a 2D grid of test sites covering the entire cross-section of the GCIB 202. The beam current analysis system may include a small aperture in front of a stationary Faraday cup (not shown). In one example, the aperture may be a through hole drilled in a workpiece 210 that utilizes the X-Y positioning table 204 (FIG. 1), or any other suitable scanning device, to scan the small aperture in a step-wise manner in two axes relative to the GCIB 202, similar to when a workpiece 210 is moved on the X-Y positioning table 204. The aperture can, for example, be a small (e.g., 2-3 mm diameter) through hole and exemplary data collection times at each X-Y position can, for example, be between 50 ms and 500 ms. In one example, a 20 mm diameter (10 mm radius) circular area was measured by moving the small aperture in the workpiece 210 to about 314 ($\pi(radius)^2$) different positions at 1 $mm^2$ intervals and collecting parametric data using a data collection time of 500 ms at each position.

Parametric data 290 (beam profile data in FIG. 2) is an average of two cross-sectional slices of the measured beam current profile of GCIB 202 containing the reactive source gas (5% $NF_3$ in $N_2$). The parametric data 290 was normalized to the peak intensity of the parametric data 280. The parametric data 280 and 290 are in good agreement around the peak maximum but the parametric data 280 obtained from the etched feature in the $SiO_2$ film exhibits a higher intensity away from the peak maximum than the parametric data 290. In another embodiment of the invention, a measured 3D current profile map may be fitted using a mathematical distribution function to obtain a beam intensity profile.

According to embodiments of the invention, parametric data relating to a beam intensity profile of the gas cluster ion beam is curve fitted with a mathematical functional shape. The parametric data may be fitted with a variety of well known mathematical functional shapes, for example a Gaussian distribution function or a Laurentzian distribution function. The Gaussian distribution function is defined as $$P_G(x, \mu, \sigma) = \frac{1}{\sqrt{2\pi}} \exp\left[-\frac{1}{2}\left(\frac{x-\mu}{\sigma}\right)^2\right]$$

$P_G(x,\mu,\sigma)$ is a continuous function describing the probability that from a parent distribution with a mean $\mu$ and a standard deviation $\sigma$, the value of a random observation would be x. The Laurentzian distribution function is defined as $$P_L(x, \mu, \Gamma) = \frac{1}{\pi} \frac{\Gamma/2}{(x-\mu)^2 + (\Gamma/2)^2}$$

As with $P_G(x,\mu,\sigma)$, $P_L(x,\mu,\Gamma)$ is symmetric about its mean $\mu$ but has a width characterized by its half-width $\Gamma$. One difference between $P_G(x,\mu,\sigma)$ and $P_L(x,\mu,\Gamma)$ is that the latter does not diminish to zero as rapidly; the behavior for large deviations is proportional to the inverse of the square of the deviation rather than exponentially related to the square of the deviation. According to one embodiment of the invention, one or more $P_G(x,\mu,\sigma)$ distribution functions are used to curve fit measured parametric data (e.g., parametric data 280 or 290) and calculate the mean value and standard deviation. Curve fitting methods are well known to one of ordinary skilled in the art. A beam intensity profile may then be obtained by rotating the mathematic distribution functions around the peak axis, thereby creating a 3D map.

Figure 3A:
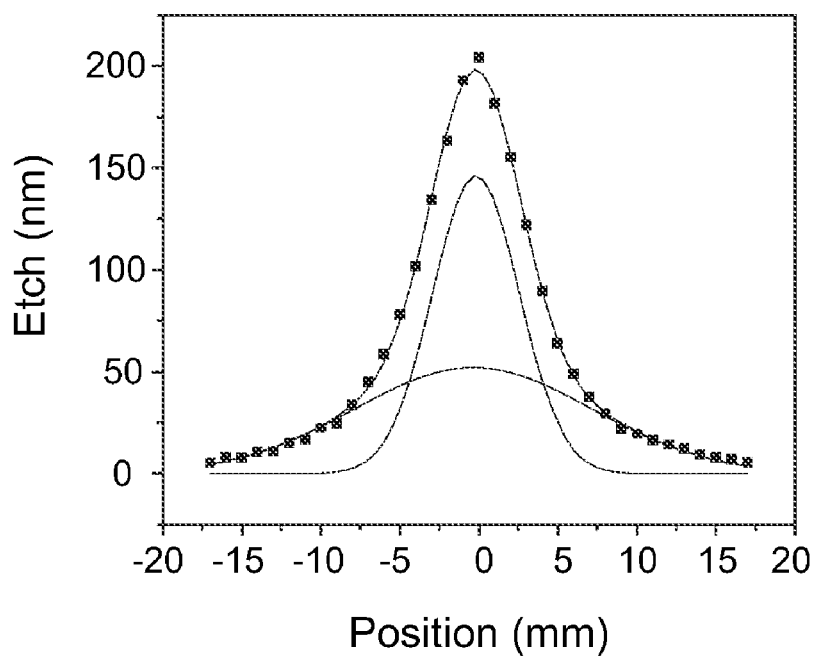
FIGS. 3A and 3B show fitting of the parametric data from FIG. 2 using mathematical distribution functions according to embodiments of the invention.
Figure 3B:
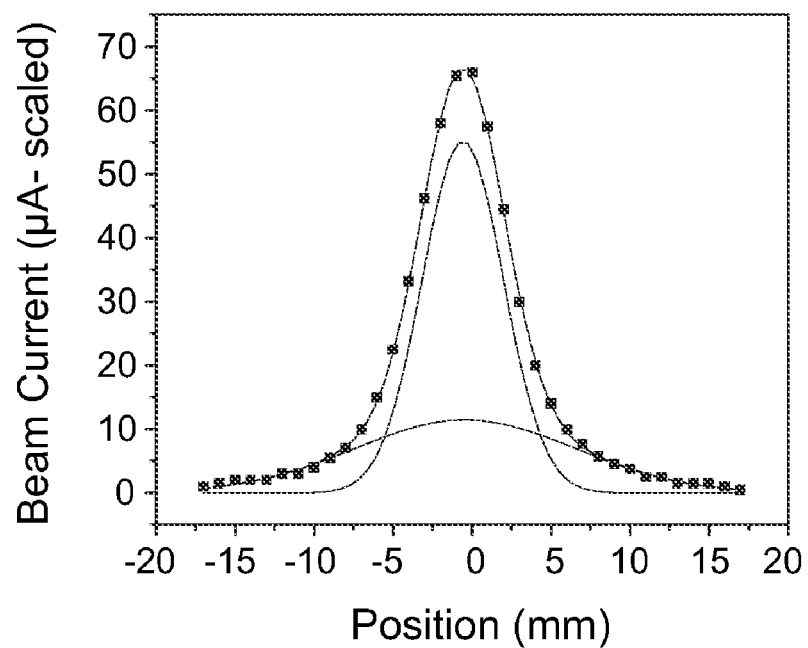

FIGS. 3A and 3B show fitting of the parametric data from FIG. 2 using mathematical distribution functions according to embodiments of the invention. FIGS. 3A and 3B show parametric data 280 and 290 from FIG. 2, respectively. The parametric data 280, 290 were each curve fitted using two Gaussian distribution functions. It was observed that a plurality of Gaussian distribution functions provided good curve fitting of the parametric data and yielded more repeatable and constant processing of workpieces 210 by the GCIB processing apparatus 200.

Figure 4:
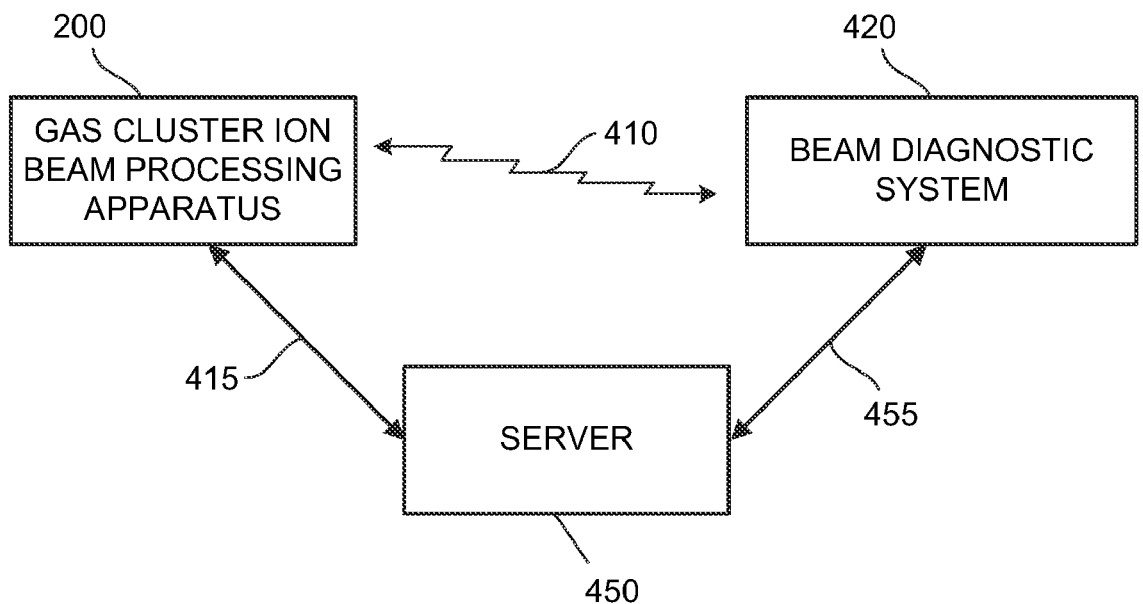
FIG. 4 is a diagrammatic view illustrating the interaction of a gas cluster ion beam processing apparatus with a beam diagnostic system.

FIG. 4 is a diagrammatic view illustrating the interaction of a gas cluster ion beam processing apparatus with a beam diagnostic system. The beam diagnostic system 420 may be configured to communicate with the GCIB processing apparatus 200 and with a host server 450. In one embodiment, the beam diagnostic system 420 can contain a beam current analysis system that is at least partly located within the vacuum vessel 102. In one example, a scanable aperture mounted in front of a stationary Faraday cup, and electronic circuitry configured to collect and process beam current data may be located within the vacuum vessel 102. Alternatively, the electronic circuitry may be located ex-situ of the vacuum vessel 102. In one embodiment, the beam diagnostic system 420 can include a metrology tool containing a spectroscopic ellipsometer, a frequency probe, an interferometer, or a profilometer ex-situ to the vacuum vessel 102. The metrology tool is located ex-situ of the GCIB processing apparatus 200, which means that the measurement equipment is located outside the vacuum vessel 102 and separate from the GCIB processing apparatus 200.

The beam diagnostic system 420 may communicate with the GCIB processing apparatus 200 by electrical signals communicated through a wired interface, such as a SEMI Equipment Communications Standard/Generic Equipment Model (SECS/GEM) wired interface. A SECS/GEM communication is a wired protocol between a host server 450, GCIB processing apparatus 200, and beam diagnostic system 420, as well as with other semiconductor manufacturing tools or equipment (not shown). SECS is a layer 6 protocol that describes the content of the messages while GEM is a higher layer application protocol that defines the messages themselves. Alternatively, the wired interface over which the electrical signals are communicated between the host server 450, GCIB processing apparatus 200, and beam diagnostic system 420, may be a registered jack (RJ) standardized physical interface such an eight-pin Ethernet (8P8C) or two-pin (RJ-11) connector, or a universal serial bus (USB) interface, or an RS-232 serial binary data connection.

In one embodiment, a SECS/GEM communication is transferred between the GCIB processing apparatus 200 and the beam diagnostic system 420 over wired communication paths 415 and 455 via host server 450. Alternatively, the GCIB processing apparatus 200 and beam diagnostic system 420 may be coupled in communication using short-range wireless technology connection 410, characterized by respective transceiver interfaces. In one embodiment, the wireless connection 410 may comprise a short-range wireless technology connection to limit interference with other processing equipment, although the invention is not so limited as a long-range wireless connection may be used in an alternative embodiment. Short-range wireless technologies, such as Bluetooth wireless technology, may communicate data signals over a distance of up to 10 meters in a frequency range between 2.402 gigahertz (GHz) and 2.480 GHz. Bluetooth protocols are described in "Specification of the Bluetooth System: Core, Version 1.1," published Feb. 22, 2001 by the Bluetooth Special Interest Group, Inc. Associated, as well as previous or subsequent, versions of the Bluetooth standard may also be supported by the wireless connection 410. Alternatively, the short-range wireless technology, such as ultra-wideband (UWB), may communicate digital data over a wide spectrum of frequency bands ranging in a frequency range between 3.1 GHz and 10.6 GHz. Other examples of a short-range wireless technology includes certified wireless universal serial bus (USB), and communications defined by the Institute of Electrical and Electronic Engineers (IEEE) 802.11, Wireless Fidelity (Wi-Fi) and IEEE 802.16 Worldwide Interoperability for Microwave Access (WiMAX) suites of standards. IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents.

In one embodiment, parametric data relating to beam intensity profile is transferred between the beam diagnostic system 420 and the GCIB processing apparatus 200 to process workpieces. According to this embodiment, beam intensity profile information is fed into the system controller 228 of GCIB processing apparatus 200 as a file containing parametric data fitted using a mathematical distribution function. Using a previously measured beam removal function and a previously measured relationship between etch rate (or deposition rate) and dose for a particular set of GCIB parameters (including GCIB energy and cluster species), a mathematical algorithm is then employed which takes the beam intensity profile based at least in part on the fitted parametric data and creates a scanning pattern for the gas cluster ion beam across a workpiece. Many different approaches to the selection of mathematical algorithm may be successfully employed in this embodiment.

Figure 5:
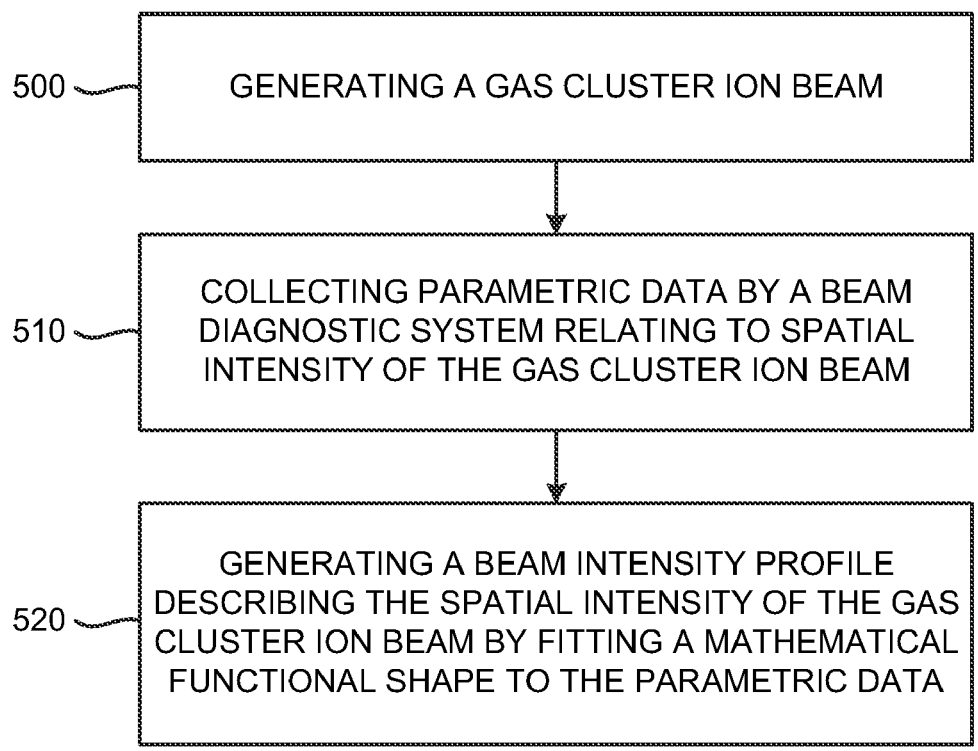
FIG. 5 is a flowchart describing one embodiment of a method of assigning a beam intensity profile to a gas cluster ion beam.

FIG. 5 is a flowchart describing one embodiment of a method of assigning a beam intensity profile to a gas cluster ion beam. In block 500, a gas cluster ion beam is generated in a gas cluster ion beam processing apparatus, for example the GCIB processing apparatus 200 in FIG. 1. In block 510, parametric data relating to the spatial intensity of the gas cluster ion beam is collected by a beam diagnostic system. In one embodiment, the gas cluster ion beam is exposed to a workpiece to etch a feature in the workpiece or in a film on the workpiece, and parametric data relating to a depth profile of the etched feature is collected. In another embodiment, the gas cluster ion beam is exposed to a workpiece to deposit a material on the workpiece, and parametric data relating to topography of the deposited material is collected. In yet another embodiment, the gas cluster ion beam is exposed to beam current analysis system that is at least partially internal to a vacuum vessel of the gas cluster ion beam processing apparatus in which the gas cluster ion beam is generated, and parametric data relating to beam current profile of the gas cluster ion beam is collected.

In block 520, a beam intensity profile describing the spatial intensity of the gas cluster ion beam is generated by fitting a mathematical functional shape to the parametric data. Exemplary mathematical functional shapes include Gaussian and Laurentzian distribution functions. In one embodiment, a plurality of mathematical functional shapes are utilized for the fitting, for example a pair of Gaussian distribution functions.

Figure 6:
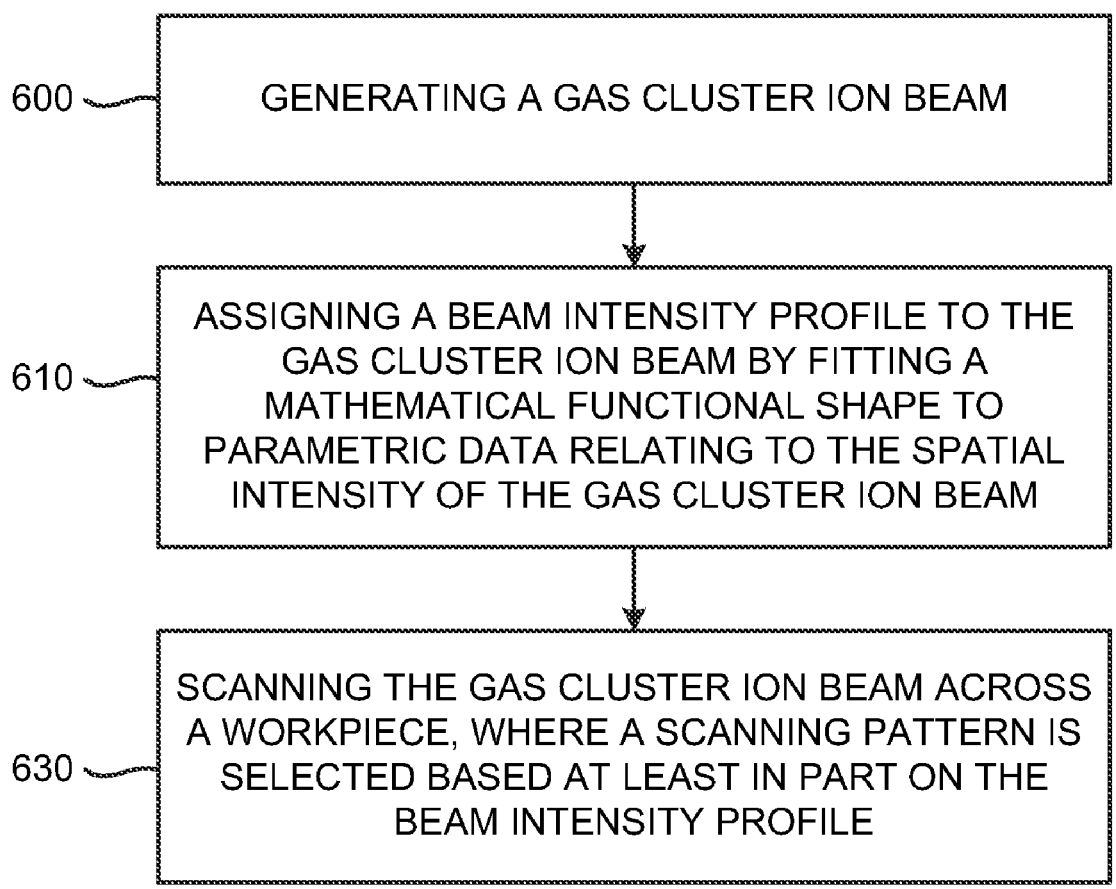
FIG. 6 is a flowchart describing one embodiment of a method of processing a workpiece using a gas cluster ion beam.

FIG. 6 is a flowchart describing one embodiment of a method of processing a workpiece using a gas cluster ion beam. In block 600, a gas cluster ion beam is generated in a gas cluster ion beam processing apparatus. In block 610, a beam intensity profile is assigned to the gas cluster ion beam by fitting a mathematical functional shape to parametric data relating to the spatial intensity of the gas cluster ion beam.

In block 630, the gas cluster ion beam is scanned across a workpiece, wherein a scanning pattern is selected based at least in part on the beam intensity profile. Scanning the gas cluster ion beam across the workpiece may be used to remove material from the workpiece or to deposit material onto the workpiece.

Multiple embodiments for assigning a beam intensity profile to a gas cluster ion beam and processing workpieces using a gas cluster ion beam has been described. The foregoing description of the embodiments of the invention have been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a workpiece is directly on and in immediate contact with the workpiece; there may be a second film or other structure between the film and the workpiece.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for assigning a beam intensity profile to a gas cluster ion beam, the method comprising:
   generating the gas cluster ion beam in a vacuum vessel of a gas cluster ion beam processing apparatus;
   collecting parametric data relating to a spatial intensity of the gas cluster ion beam; and
   generating the beam intensity profile by fitting a mathematical functional shape to the parametric data.

2. The method of claim 1, wherein collecting the parametric data comprises:
   etching a feature in a workpiece or in a film on the workpiece using the gas cluster ion beam; and
   measuring the parametric data from a depth profile of the etched feature using a beam diagnostic system including an ex-situ metrology tool that is external to the vacuum vessel.

3. The method of claim 2, wherein the workpiece is stationary when the feature is etched, and the etched feature comprises a circular etch feature in the workpiece or in the film on the workpiece.

4. The method of claim 2, further comprising:
   scanning the workpiece and the gas cluster ion beam relative to each other, when the feature is etched, such that the etched feature comprises a trench in the workpiece or in the film on the workpiece.

5. The method of claim 2, wherein the ex-situ metrology tool comprises a spectroscopic ellipsometer, a frequency probe, or an interferometer.

6. The method of claim 1, wherein collecting the parametric data comprises:
   depositing a material on a workpiece using the gas cluster ion beam; and
   measuring the parametric data from a topography of the deposited material using a beam diagnostic system including an ex-situ metrology tool that is external to the vacuum vessel.

7. The method of claim 6, wherein the ex-situ metrology tool comprises a spectroscopic ellipsometer, a frequency probe, an interferometer, or a profilometer.

8. The method of claim 1, wherein collecting the parametric data comprises:
   exposing the gas cluster ion beam to a beam diagnostic system including a beam current analysis system that is at least partially internal to the vacuum vessel; and
   measuring a beam current profile of the gas cluster ion beam using the beam diagnostic system to supply the beam intensity profile.

9. The method of claim 8, wherein the beam current analysis system comprises a scanable aperture in front of a stationary Faraday cup.

10. The method of claim 1, wherein the parametric data comprises a cross-sectional slice of the spatial intensity of the gas cluster ion beam, and the beam intensity profile is generated by rotating the mathematical functional shape around a propagation axis of the gas cluster ion beam.

11. The method of claim 1, wherein the mathematical functional shape comprises one or more Gaussian or Laurentzian distribution functions.

12. A method for processing a first workpiece using a gas cluster ion beam, the method comprising:
   generating the gas cluster ion beam in a vacuum vessel of a gas cluster ion beam processing apparatus;
   assigning a beam intensity profile to the gas cluster ion beam by fitting a mathematical functional shape to parametric data relating to a spatial intensity of the gas cluster ion beam; and
   scanning the gas cluster ion beam and the first workpiece relative to each other with a scanning pattern based at least in part on the beam intensity profile.

13. The method of claim 12, wherein assigning the beam intensity profile comprises:
   etching a feature in a second workpiece or in a film on the second workpiece using the gas cluster ion beam; and
   collecting the parametric data from a depth profile of the etched feature using a beam diagnostic system containing an ex-situ metrology tool that is external to the vacuum vessel.

14. The method of claim 13, wherein the second workpiece is stationary when the feature is etched, and the etched feature comprises a circular etch feature in the second workpiece or in the film on the second workpiece.

15. The method of claim 13, wherein the second workpiece and the gas cluster ion beam are scanned relative to each other when the feature is etched, and the etched feature comprises a trench in the workpiece or in the film on the workpiece.

16. The method of claim 13, wherein the ex-situ metrology tool comprises a spectroscopic ellipsometer, a frequency probe, or an interferometer.

17. The method of claim 12, wherein assigning the beam intensity profile comprises:
   depositing a material on a second workpiece using the gas cluster ion beam; and
   collecting the parametric data from a topography of the deposited material on the second workpiece using a beam diagnostic system containing an ex-situ metrology tool that is external to the vacuum vessel.

18. The method of claim 17, wherein the ex-situ metrology tool comprises a spectroscopic ellipsometer, a frequency probe, an interferometer, or a profilometer.

19. The method of claim 12, wherein assigning the beam intensity profile comprises:
   exposing the gas cluster ion beam to a beam diagnostic system containing a beam current analysis system comprising a scanable aperture in front of a stationary Faraday cup internal to the vacuum vessel; and
   collecting the parametric data using the beam diagnostic system to assess the spatial intensity of the gas cluster ion beam.

20. The method of claim 12, wherein the mathematical functional shape comprises one or more Gaussian or Laurentzian distribution functions.

21. A processing system, comprising:
   a gas cluster ion beam processing apparatus configured for generating a gas cluster ion beam;
   a beam diagnostic system configured to collect parametric data relating to a spatial intensity of the gas cluster ion beam; and
   a controller coupled in communication with the gas cluster ion beam processing apparatus and the beam diagnostic system, the controller configured to receive the parametric data communicated from the beam diagnostic system, to generate a beam intensity profile describing the spatial intensity of the gas cluster ion beam by fitting a mathematical functional shape to the parametric data, to generate control signals for operation of the gas cluster ion beam processing apparatus that represent a scanning pattern across a workpiece determined from the beam intensity profile, and to communicate the control signals to the gas cluster ion beam processing apparatus, wherein the scanning pattern is selected based at least in part on the beam intensity profile.

22. The processing system of claim 21, wherein the gas cluster ion beam processing apparatus includes a vacuum vessel, a source configured to produce a gas cluster ion beam inside the vacuum vessel, and a workpiece support including an X-Y positioning table in the vacuum vessel.

23. The processing system of claim 21, wherein the beam diagnostic system comprises a beam current analysis system or an ex-situ metrology tool including a spectroscopic ellipsometer, a frequency probe, an interferometer, or a profilometer.

* * * * *